(12) United States Patent
Zhang

(10) Patent No.: US 9,059,054 B1
(45) Date of Patent: Jun. 16, 2015

(54) INTEGRATED CIRCUIT PACKAGE HAVING IMPROVED COPLANARITY

(71) Applicant: Nvidia Corporation, Santa Clara, CA (US)

(72) Inventor: Leilei Zhang, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 9 days.

(21) Appl. No.: 14/151,671

(22) Filed: Jan. 9, 2014

(51) Int. Cl.
*H01L 23/02* (2006.01)
*H01L 23/14* (2006.01)
*H01L 23/538* (2006.01)
*H01L 25/18* (2006.01)

(52) U.S. Cl.
CPC ............ *H01L 23/14* (2013.01); *H01L 23/5384* (2013.01); *H01L 25/18* (2013.01)

(58) Field of Classification Search
None
See application file for complete search history.

(56) References Cited

U.S. PATENT DOCUMENTS

| 2011/0037179 | A1* | 2/2011 | Limaye et al. | 257/778 |
| 2012/0168951 | A1* | 7/2012 | Kim et al. | 257/762 |
| 2012/0234589 | A1* | 9/2012 | Furuichi et al. | 174/261 |

* cited by examiner

*Primary Examiner* — Yasser A Abdelaziez

(57) ABSTRACT

One aspect of the present disclosure provides an IC substrate, comprising a first material layer located on a first side of the IC substrate, and a second material layer located on a second, opposing side of the IC substrate, wherein the second material layer has a higher coefficient of thermal expansion CTE value than the first material layer.

10 Claims, 5 Drawing Sheets

INTEGRATED CIRCUIT PACKAGE HAVING IMPROVED COPLANARITY

TECHNICAL FIELD

This application is directed to an integrated circuit package.

BACKGROUND

As the form factor for electronic devices, such as cell phones or portable tablets, has become more compact, performance demands for those same electronic devices has increased. Integrated circuit (IC) manufacturers have sought different ways to achieve both of these demands. One way in which IC manufacturers have met performance demand requirements is through the implementation of package-on-package or POP, IC packages. POP packages typically include expanded memory circuits in which memory chips are vertically and directly connected to an underlying integrated processor through solder balls. This has provided more memory capacity for the ever growing performance demands for the above-mentioned electronic devices. However, as performance demands have continued to grow, manufacturers have sought additional ways to expand processing and memory capability while adhering to the "thin" form factor that consumers have grown to expect in such devices. To achieve this, they have increased the size of the footprint (i.e., length/width dimensions) of the underlying printed circuit board (PCB) to which the integrated processor is connected, while keeping the height reduced as much as possible.

SUMMARY

One aspect of the present disclosure provides an IC substrate comprising a first material layer located on a first side of the IC substrate, and a second material layer located on a second, opposing side of the IC substrate, wherein the second material layer has a higher coefficient of thermal expansion (CTE) value than the first material layer.

Another embodiment of the present disclosure is directed to an IC package on package (POP) device. In one embodiment, the POP device comprises an IC carrier substrate that comprises a first material layer located on a first side of the IC carrier substrate. The first material layer has a CTE and bond pads located therein that form a first contact array. The IC carrier substrate further includes a second material layer located on a second, opposing side of the IC carrier substrate. The second material layer has a CTE different from the first material layer and bond pads located therein that form a second contact array. The POP device further comprises an IC device electrically coupled to the first side of the IC carrier substrate through the first contact array and having a CTE that is substantially equal to the CTE of the first material layer and further comprises a PCB coupled to the second side of the IC carrier substrate through the second contact array and having a CTE that is substantially equal to the CTE of the second material layer.

BRIEF DESCRIPTION

Reference is now made to the following descriptions taken in conjunction with the accompanying drawings, in which.

DETAILED DESCRIPTION

As discussed above, manufacturers have sought additional ways to expand processing and memory capability while adhering to a "thin" form factor. To achieve this, they have increased the size of the footprint (i.e., length/width dimensions) of the underlying printed circuit board (PCB) to which the integrated processor is connected, while keeping the height significantly reduced, from 12 mm to 17 mm with a reduction in thickness from 1.5 mm to 1 mm. However, the implementation of these thinner IC boards has caused warping problems to arise, which causes the IC devices to become non-planar. IC board warpage can cause undesirable defects to occur in the device, thereby affecting long-term IC performance.

In addition to achieving the above-mentioned thinner form factors, manufacturers must also be concerned with glass transition temperatures (Tg) of the circuit boards and achieving a good balance of thermal and mechanical properties in a wide process window. To this end, manufacturers have begun to lower the Tg slightly and enhance the resin component of multilayer printed circuits by lowering the CTE. The CTE is defined as the ratio of the change in length of a material per degree Celsius. Thermal expansion is important in design considerations, as it can dictate important parameters, such as the composite filler size and shape. In this manner, it is possible in the manufacture of multilayer circuit board to achieve a circuit board that is extremely reliable and cost effective in high volumes. Low CTE epoxies are currently being utilized extensively in a variety of IC board manufacturing programs. As the industry becomes less Tg oriented and more performance based, the use of low CTE epoxies has grown significantly with low CTE technology.

However, contrary to the general trend of the industry, the present disclosure recognizes that mismatch between a lower CTE material adjacent a higher CTE material, such as what comprises a PCB, can lead to warpage of the IC carrier substrate and that a higher CTE material can be used in one or more of the layers of the IC carrier substrate board to provide improved coplanarity in thin IC carrier boards.

Figure 1:
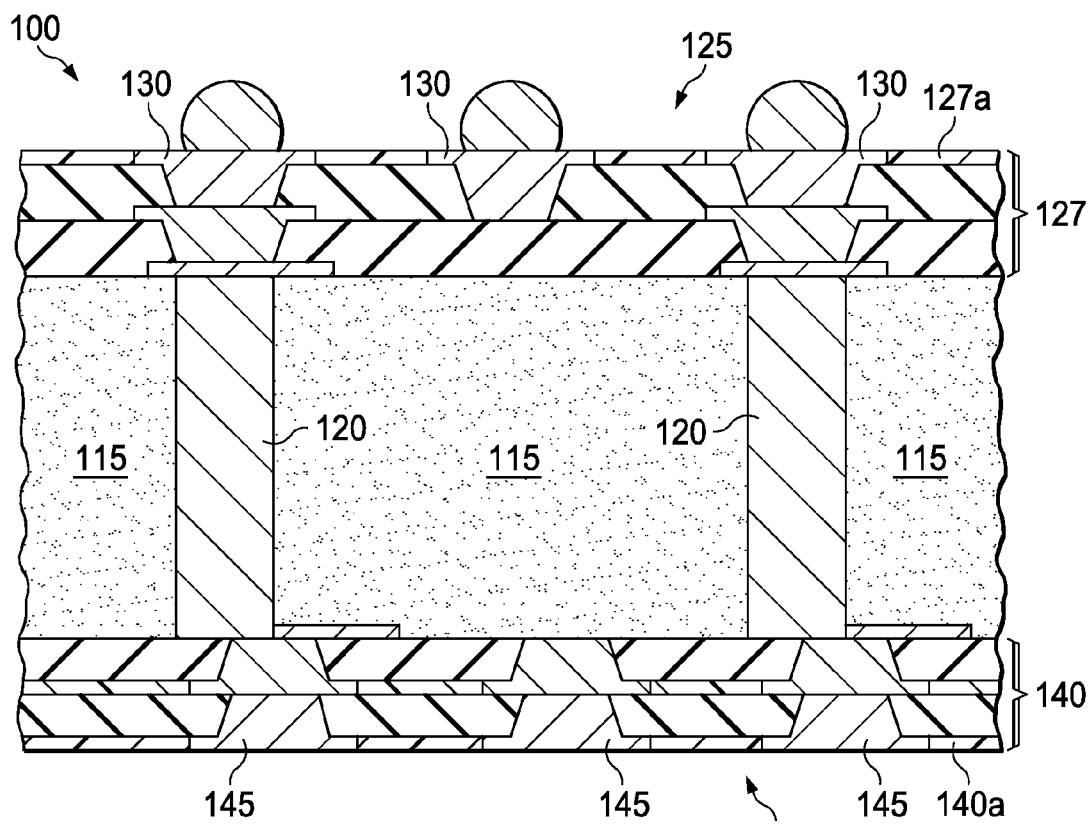
FIG. 1 illustrates one embodiment of an IC carrier substrate provided by the present disclosure.

FIG. 1 illustrates one embodiment of an IC carrier substrate 100. In the illustrated embodiment, the IC carrier substrate 100 comprises one or more material layers 110 on one side of the IC carrier substrate 100. The IC carrier substrate 100 may be manufactured using conventional processes and materials, such as an Ajinomoto Build-up Film (ABF) processes that use organic, epoxy-based resins containing a filler component, such as silicon, silicon dioxide, or micro-glass spheres, to achieve a desired parts per million (ppm)/oC concentration that affect the CTE of the film. It should be understood that the present disclosure is not limited to any particular organic epoxy-based, filled resin system. Such systems are well known to those skilled in the art of electronic board manufacturing processes and various epoxy filled resins may be selected as board design as specification requires. In one embodiment, the IC substrate 100 may comprise an epoxy resin core 115 having a CTE of about 6 ppm/oC and conductive vias 120 extending through the resin core 115. The vias 120 connect opposing sides of the IC substrate 100, as shown.

The IC substrate 100 has one side 125 to which an IC device, not shown, such as a microprocessor, may be attached. Side 125 may be comprised of one or more material layers 127, at least one of which, is comprised of an epoxy filled resin having a CTE that is substantially the same as the CTE of the IC device to which the IC carrier substrate 100 will ultimately be connected. As used herein and in the claims, a CTE of one material is substantially the same as or equal to a CTE of another material when the CTE of each material is within 3 ppm/oC of each other. In one embodiment, the CTE of layer 127*a* matches or substantially matches the CTE of the IC device that is to be attached to the IC carrier substrate 100, and in such embodiments, the layer 127*a* may have a filler component sufficient to cause the layer 127*a* to have a CTE of about 3 ppm/oC. The material layer 127*a* also has a set of bond pads 130 located therein that form a contact array. In certain embodiments, the material layer 127*a* is or adjacent the outermost material layer of the first side 125 such that it is relatively close to the IC device when it is attached to the IC carrier substrate 100. The bond pads 130 form a contact array that can be used to electrically connect side 125 of the IC substrate 100 to an IC device, as discussed below. It should be noted that, in some embodiments, one or more of the layers 127 may have the same CTE as layer 127*a*.

The embodiment of the IC carrier substrate 100 illustrated in FIG. 1 further comprises an opposing side 135 that may be attached to a PCB component board (not shown). Side 135 may be comprised of one or more material layers 140, at least one of which is comprised of an epoxy filled resin having a CTE that is higher than the material layer or layers located on side 125 of the IC carrier substrate and is substantially the same as the CTE of the PCB component board to which the IC carrier substrate 100 will ultimately be connected. In one embodiment, the CTE of layer 140*a* matches or substantially matches the CTE of the PCB board and may have a filler component sufficient to cause the CTE to range from about 6 ppm/oC to about 14 ppm/oC. The material layer 140*a* also has a set of bond pads 145 located therein that form a contact array on the opposing, side 135 that can be used to electrically connect side 135 of the IC carrier substrate 100 to a component board, such as a PCB, which typically has a higher CTE than the IC device that is attached to side 125. In certain embodiments, the material layer 140*a* is or adjacent the outermost material layer of side 135 such that it is relatively close to a PCB to which the IC carrier substrate 100 will be attached. The bond pads 145 can be used to connect side 135 of the IC carrier substrate 100 to a PCB board. It should be noted that, in some embodiments, one or more of the layers 140 may have the same CTE as layer 140*a*.

One or more of the material layers 140 may be comprised of the same organic-based epoxy resin material as material layers 127, so that existing manufacturing equipment, processes and materials can be used to deposit or form and pattern these layers where needed for certain applications. For example, the material layer 140*a* can be a conventional built-up material, such as an Ajinomoto Build-up Film (ABF). However, it is selected and formed in a way to cause it to have a CTE that is equal to or substantially the same as that of the component board to which it will ultimately be connected.

In conventional configurations to achieve lower CTE goals, as noted above, manufacturers often use low CTE material on both sides of the IC carrier substrate. However, the present disclosure recognizes that the CTE of the layers on opposing sides of the IC carrier substrate may be formed to have a CTE that more closely matches the substrate to which that side of the IC carrier substrate will be ultimately attached. Because the CTE of the adjacent layers of the IC carrier substrate matches or substantially matches the substrate to which that respective side will be attached, the warpage that can occur from disparate CIE's of adjoining substrates can be reduced. As noted above, this is counter-intuitive to the current manufacturing practices of using a lower CTE material for layers on both sides of the IC carrier substrate.

Figure 2A:
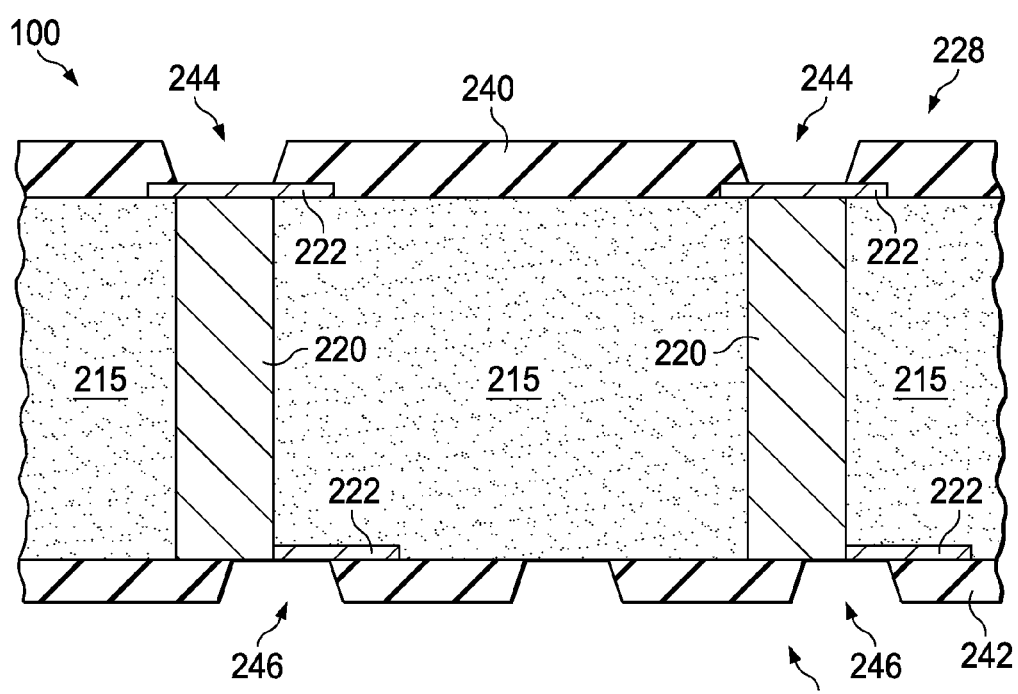
FIGS. 2A-2E illustrate general stages of fabrication of one embodiment of the IC carrier substrate 100 of FIG. 1, as provided by this disclosure.

FIGS. 2A through 2E illustrate general stages of fabrication of one embodiment of the IC carrier substrate 100 of FIG. 1, as provided by this disclosure. FIG. 2A illustrates the IC carrier substrate 100 of FIG. 1 at an early stage of manufacture. At this point, a core 215 having vias 220 formed therethrough is provided. Metal runners 222 contact each of the vias 220 on side 228 and opposing side 230 of the core 215. Material layers 240, 242, such as those discussed above, are formed on side 228 and opposing side 230, respectively. At this point in the fabrication process, the CTE of material layers 240, 242 may match the CTE of the substrates to which sides 228, 230 will be respectively attached, or the CTE may be unadjusted and within typical ranges. Conventional process may be used to patterned and form contact openings 244 and 246 within the material layer 240, 242, as generally shown.

Figure 2B:
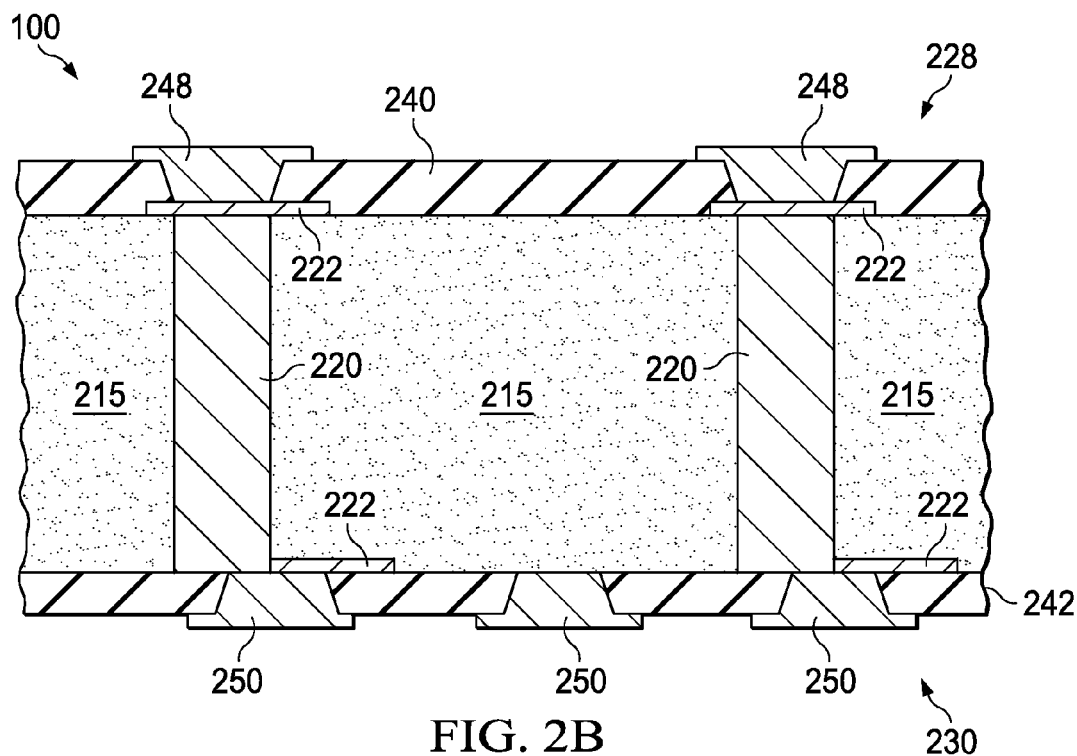

FIG. 2B illustrates the IC carrier substrate 100 of FIG. 2A following the conventional metal deposition and subsequent processing to form first layer contacts 248 and 250 that form part of the electrical interconnect of the IC substrate 100.

Figure 2C:
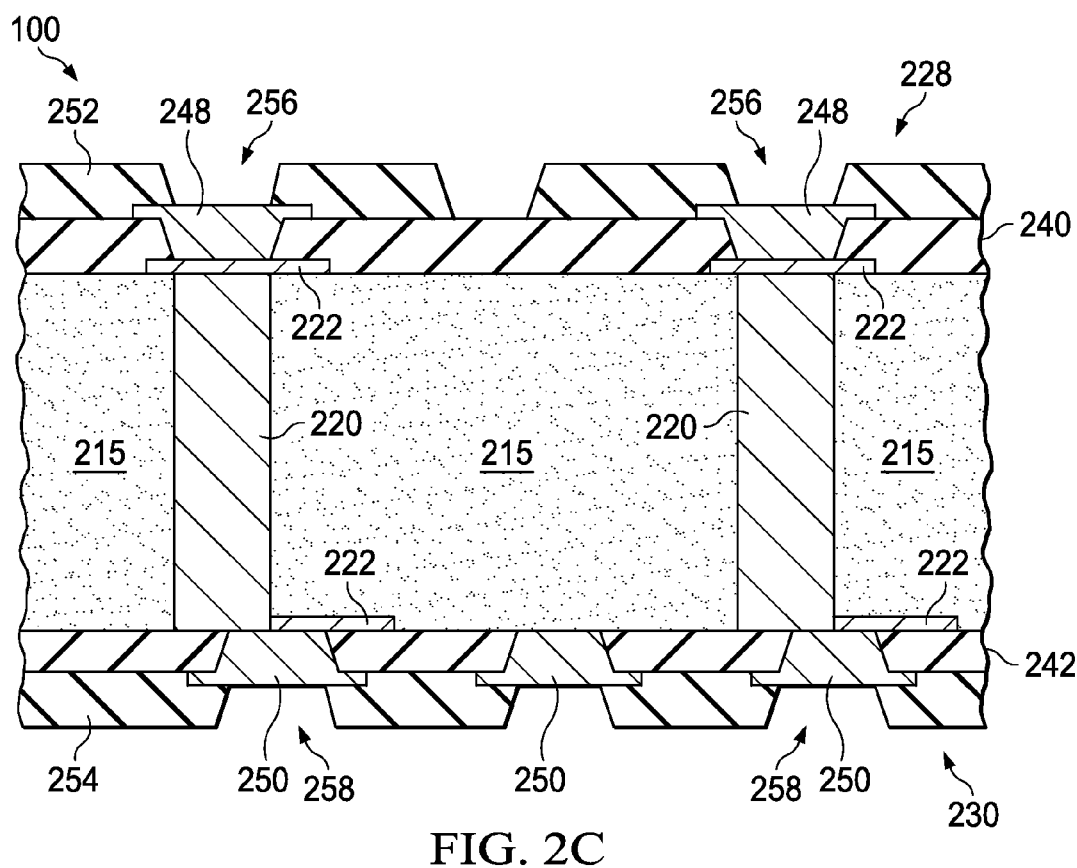

FIG. 2C illustrates the IC carrier substrate 100 of FIG. 2B following the deposition and patterning of material layers 252, 254, such as those discussed above. The material layers 252, 254 are formed over material layers 240 and 242 located on the first side 228 and second side 230, respectively. At this point in the fabrication process, the CTE of material layers 252, 254 may match the CTE of the substrates to which sides 228, 230 will be respectively attached, or the CTE may be unadjusted and within typical ranges. Conventional process may be used to deposit and pattern the material layers 252, 254 to form contact openings 256 and 258 within the material layer 252, 254, as generally shown.

Figure 2D:
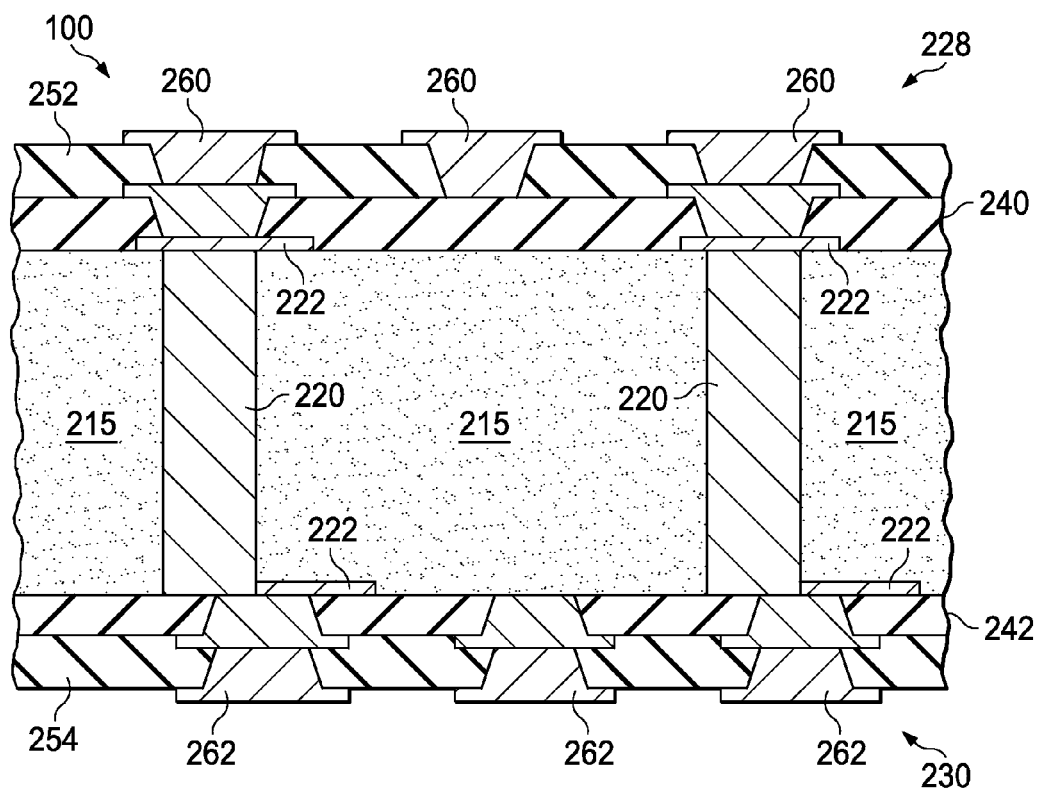

FIG. 2D illustrates the IC carrier substrate 100 of FIG. 2C following the conventional metal deposition and subsequent processing to form layer contacts 260 and 262 that function has a contact array to provide electrical connection from the IC substrate 100 to IC component or component boards that will be electrically connected to the IC substrate 100.

Figure 2E:
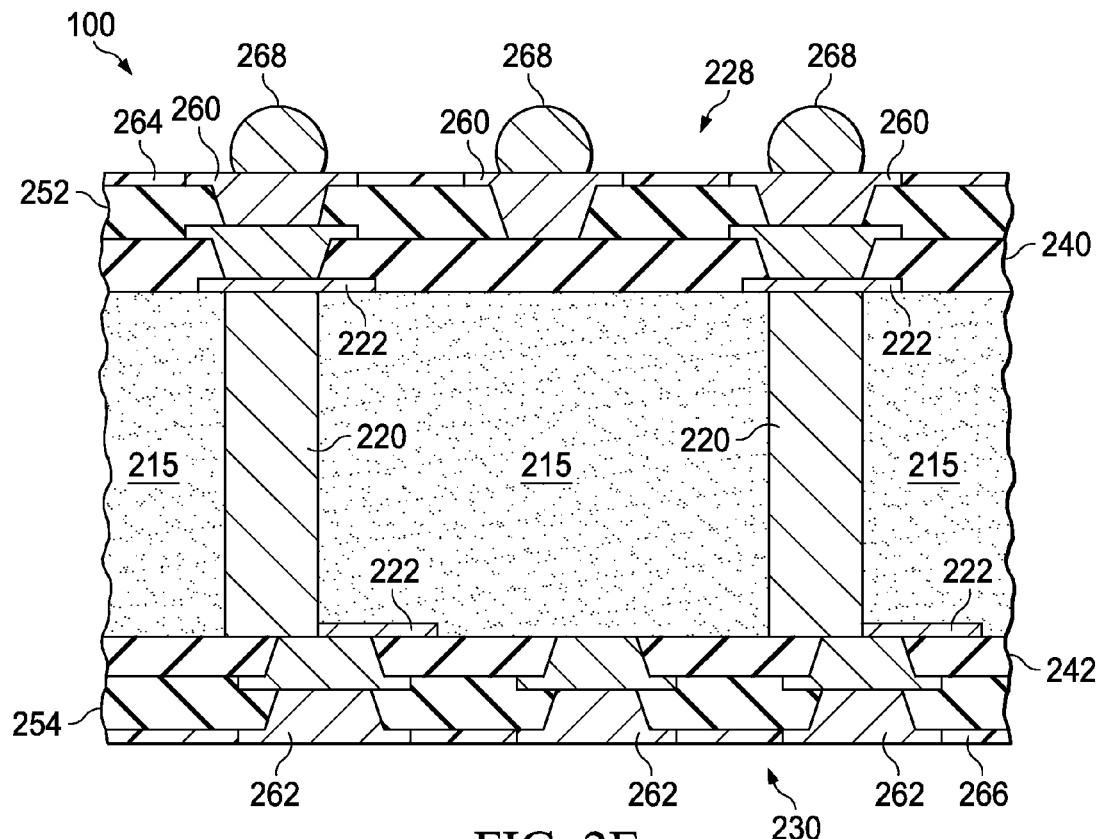

FIG. 2E illustrates the IC carrier substrate 100 of FIG. 2D following the deposition and patterning of third material layers 264 and 266 on sides 228 and 230, respectively, and the placement of solder balls 268 on side 228, which are shown for illustrative purposes only. In one embodiment, material layers 264 and 266 have a CTE that is designed to substantially match the CTE of the substrate to which side 228 and side 230 will be respectively attached. In another embodiment, material layers 252 and 254, in addition to material layers 264 and 266, will have a CTE that is designed to match the CTE of the substrate to which side 228 and side 230 will be respectively attached. In yet another embodiment, material layers 240 and 242, in addition to material layers 264, 266, 264, and 266 will have a CTE that is designed to match the CTE of the substrate to which side 228 and opposing side 230 will be respectively attached. In other embodiments, one or more of the above-mentioned layers may have a CTE that is designed to match the CTE of the substrate to which side 228 and side 230 will be respectively attached. It should be noted that while three layers are shown on each side of the IC carrier substrate 100, the present disclosure is not limited to this particular number and other embodiments may have less than or more than three material layers.

Figure 3:
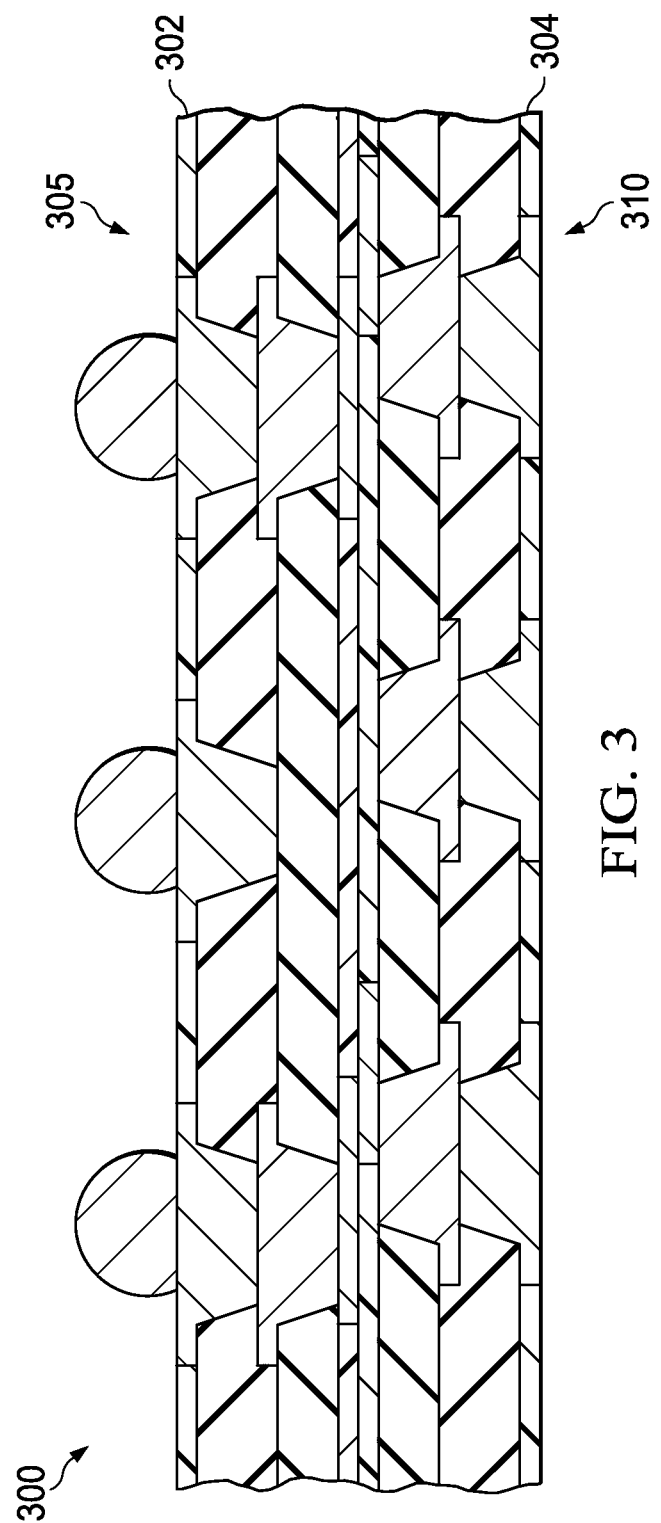
FIG. 3 illustrates another embodiment of the IC carrier substrate as provided herein.

FIG. 3 illustrates another embodiment of an IC carrier substrate 300 which does not have the resin core of the embodiment illustrated in FIGS. 1 and 2E but does have at least one material layer 302, 304 located on opposite sides 305 and 310 of the IC carrier substrate 300 that have a CTE that is designed to match the CTE of the substrate to which side 305 and side 410 will be respectively attached. Conventional deposition and patterning processes may be used to fabricate the embodiment shown in FIG. 3.

Figure 4:
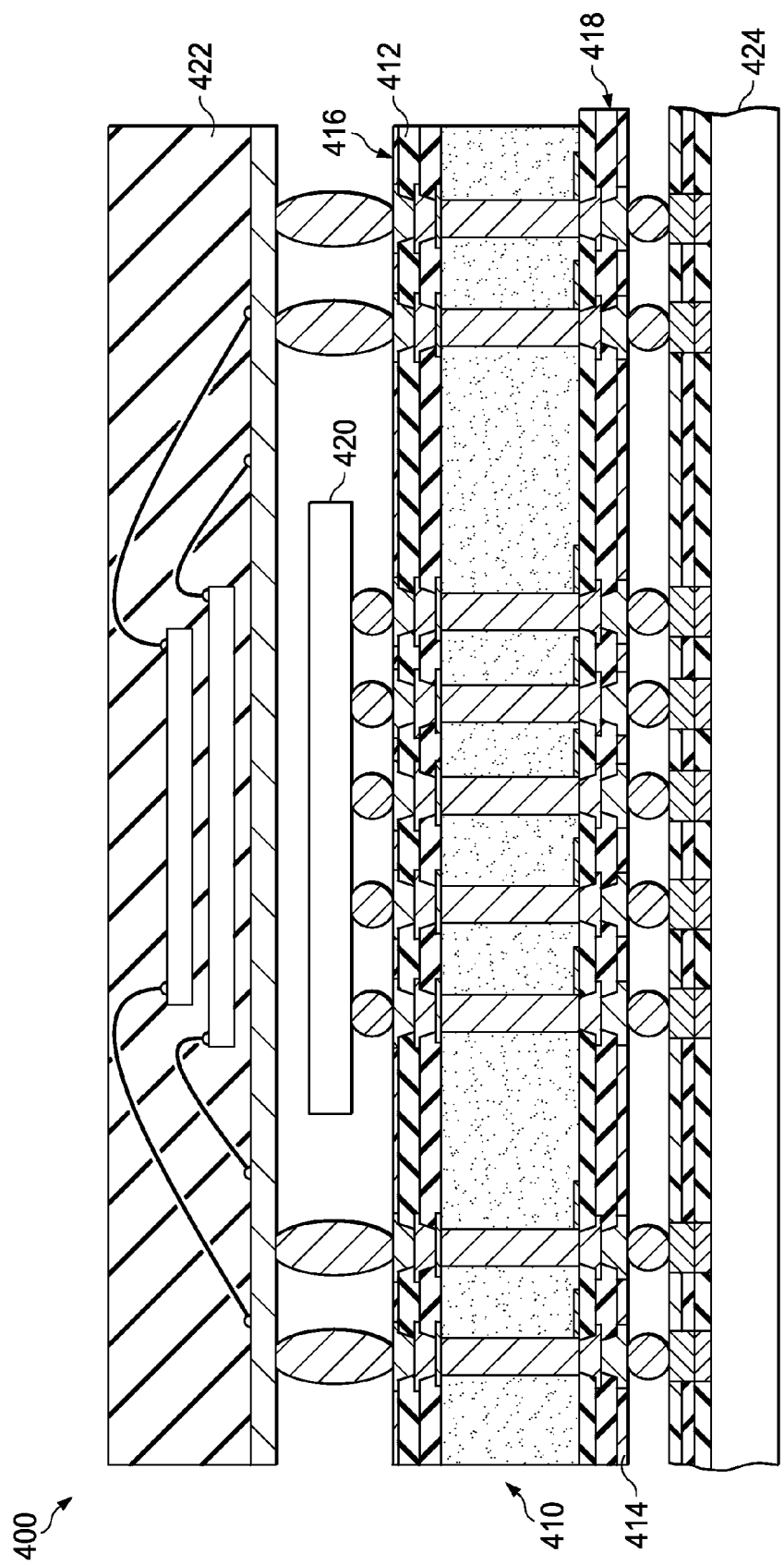
FIG. 4 illustrates an embodiment of a POP device in which the IC carrier substrate of the present disclosure may be used.

FIG. 4 illustrates an embodiment of POP device 400 in which the IC carrier substrate 100 or 300 of the present disclosure may be used. The IC device 400 comprises an embodiment of the IC carrier substrate 410, as discussed above, and therefore, has a resin core, as discussed above. The IC carrier substrate 410 has one or more material layers 412, 414 located on opposing sides 416, 418 of the IC carrier substrate 410 that has a CTE that is designed to substantially match the CTE of the respective substrate to which the opposing sides 416, 418 are attached, as discussed below.

The IC package 400 further comprises an IC device 420, such as a microprocessor that is electrically attached to the side 416 of the IC carrier substrate 410 and another IC device 422, such as a memory package, that is attached to the first side 416 of the IC carrier substrate 410, as generally illustrated. Either one or both of the IC device 420 or the IC device 422 may be comprised of a lower CTE material. For example, to achieve the industry's goals as noted above, the IC device 420 may have a CTE of about 3 ppm/oC. In such instances, the CTE of one or more of the material layers of the IC carrier device 410 on side 416 of the IC carrier substrate 410 will also be about 3 ppm/oC.

The IC package 400 further comprises a PCB board 424. The PCB board 424 may be of conventional design, comprising multiple layers of epoxy-based resin having interconnected traces located therebetween that form an interconnection pattern within the PCB 424. Given its conventional design, the PCB 424 may have a CTE that ranges from about 4 ppm/oC to about 14 ppm/oC. As such, the second side 418 of the IC carrier substrate 410 will have one or more material layers, as described above, that has a CTE that may also range from about 4 ppm/oC to about 14 ppm/oC to match or substantially match the CTE of the PCB 424. For example, if the CTE of the PCB 424 is about 10 ppm/oC, then the CTE of one or more of the material layers located on side 418 of the IC carrier substrate 410 will also be about 10 ppm/oC.

Thus, the present disclosure provides an IC carrier substrate that is designed to substantially match the CTE of the substrate to which the respective sides of the IC carrier substrate will be attached. In view of the more closely matched CTE of the materials, warpage can be reduced, thereby improving the coplanarity of the packaged IC device 400.

Those skilled in the art to which this application relates will appreciate that other and further additions, deletions, substitutions and modifications may be made to the described embodiments.

What is claimed is:

1. An integrated circuit (IC) package on package (POP) device, comprising:
    an IC carrier substrate having,
        a first material layer located on a first side of said IC carrier substrate, said first material layer having a coefficient of thermal expansion (CTE) and bond pads located therein that form a first contact array; and
        a second material layer located on a second, opposing side of said IC carrier substrate, said second material layer having a CTE different from said first material layer and bond pads located therein that form a second contact array;
    an IC device electrically coupled to said first side of said IC carrier substrate through said first contact array and having a CTE that is substantially equal to said CTE of said first material layer; and
    a printed circuit board (PCB) coupled to said second side of said IC carrier substrate through said second contact array and having a CTE that is substantially equal to said CTE of said second material layer.

2. The POP device of claim 1, wherein said second material layer comprises an organic resin having a filler component causing said CTE of said second material layer to range from about 6 ppm/oC to about 14 ppm/oC.

3. The POP device of claim 1, wherein said first material layer comprises an organic resin having a filler component causing a CTE of said first material layer to be about 3 ppm/oC.

4. The POP device of claim 1, wherein said second material layer is one of a plurality of material layers located on said second side.

5. The POP device of claim 1, wherein said plurality of said material layers have a same CTE.

6. The POP device of claim 1, wherein said first material layer is one of a plurality of material layers located on said first side.

7. The POP device of claim 6, wherein said plurality of said material layers on said first side have a same CTE.

8. The POP device of claim 1 further including a packaged IC device located over said IC device and being electrically connected to said IC carrier substrate by said first contact array.

9. The POP device of claim 1, wherein said IC device is a microprocessor.

10. The POP device of claim 8, wherein said packaged IC device is a memory device.

\* \* \* \* \*

UNITED STATES PATENT AND TRADEMARK OFFICE
CERTIFICATE OF CORRECTION

PATENT NO. : 9,059,054 B1
APPLICATION NO. : 14/151671
DATED : June 16, 2015
INVENTOR(S) : Leilei Zhang Page 1 of 1

It is certified that error appears in the above-identified patent and that said Letters Patent is hereby corrected as shown below:

IN THE SPECIFICATION

In column 4, line 4, after --from disparate-- delete the word "CIE's" and insert the word --CTE's--

Signed and Sealed this
Sixth Day of October, 2015

Michelle K. Lee
*Director of the United States Patent and Trademark Office*